United States Patent
Seesink (10) Patent No.: US 10,847,189 B1
(45) Date of Patent: Nov. 24, 2020

(54) VOLTAGE REGULATOR FOR GENERATION OF A VOLTAGE FOR A RAM CELL

(71) Applicant: Dialog Semiconductor B.V., s-Hertogenbosch (NL)

(72) Inventor: Petrus Hendrikus Seesink, Ouddorp (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/107,720

(22) Filed: Aug. 21, 2018

(51) Int. Cl.
*G11C 5/14* (2006.01)
*G11C 11/419* (2006.01)
*G11C 11/412* (2006.01)
*G11C 5/00* (2006.01)
*G05F 1/59* (2006.01)

(52) U.S. Cl.
CPC .............. *G11C 5/005* (2013.01); *G05F 1/59* (2013.01); *G11C 5/143* (2013.01); *G11C 5/144* (2013.01); *G11C 5/147* (2013.01); *G11C 11/419* (2013.01); *G11C 11/4125* (2013.01)

(58) Field of Classification Search
CPC .......... G11C 5/144; G11C 5/147; G11C 5/143
USPC ................................................. 365/227, 228
See application file for complete search history.

(56) References Cited

U.S. PATENT DOCUMENTS

| | | | | |
|---|---|---|---|---|
| 5,180,967 A | * | 1/1993 | Yamazaki | G05F 3/262 323/312 |
| 6,965,264 B1 | * | 11/2005 | Chan | H03K 19/0013 257/E27.063 |
| 7,659,772 B2 | * | 2/2010 | Nomura | H03K 19/0008 327/534 |
| 7,772,890 B2 | * | 8/2010 | Marshall | H03K 19/0963 326/95 |
| 8,473,879 B2 | * | 6/2013 | Joshi | G11C 29/006 716/100 |
| 9,792,979 B1 | * | 10/2017 | Dreesen | G11C 11/417 |
| 9,819,173 B2 | * | 11/2017 | Endo | G05F 1/567 |
| 9,922,699 B1 | * | 3/2018 | Sinangil | G11C 11/417 |
| 2017/0017253 A1 | * | 1/2017 | Onishi | G05F 3/262 |

OTHER PUBLICATIONS

"Current Source & Bias Circuits," CSE 577 Spring 2011, by Insoo Kim et al., Feb. 22, 2011, Mixed Signal CHIP Design Lab, Department of Computer Science & Engineering, The Pennsylvania State University, 30 pages.

* cited by examiner

*Primary Examiner* — Son L Mai
(74) *Attorney, Agent, or Firm* — Saile Ackerman LLC; Stephen B. Ackerman (57) ABSTRACT

A voltage regulator and a method for generating a retention voltage for a RAM cell that is sufficiently high to prevent data loss, while minimizing leakage currents are presented. The A voltage regulator is used for generating at least one voltage. The regulator contains mirror circuitry, a leakage device coupled to the mirror circuitry, and a first resistive device coupled to the mirror circuitry via a first output node. The mirror circuitry mirrors a leakage current from the leakage device to the first resistive device, and the leakage current contributes to the generation of a first reference voltage at the first output node.

18 Claims, 6 Drawing Sheets

FIG. 6A — HVT 64k RAMc, Vdd_retention = 0.8V

| corner | slow | slow | slow | typ | typ | typ | fast | fast | fast | unit |
|---|---|---|---|---|---|---|---|---|---|---|
| temp | -25 | 25 | 100 | -25 | 25 | 100 | -25 | 25 | 100 | °C |
| Vddr0 | 0.8 | 0.8 | 0.8 | 0.8 | 0.8 | 0.8 | 0.8 | 0.8 | 0.8 | V |
| i_retention | 428 | 435 | 969 | 445 | 472 | 2529 | 495 | 737 | 13520 | nA |
| power | 342 | 348 | 775 | 356 | 377 | 2023 | 396 | 590 | 10816 | nW |

(600)

FIG. 6B — HVT 64k RAMc, Adaptive Vdd_retention

| corner | slow | slow | slow | typ | typ | typ | fast | fast | fast | unit |
|---|---|---|---|---|---|---|---|---|---|---|
| temp | -25 | 25 | 100 | -25 | 25 | 100 | -25 | 25 | 100 | °C |
| Vddr | 0.322 | 0.239 | 0.179 | 0.262 | 0.186 | 0.160 | 0.201 | 0.157 | 0.152 | V |
| i_retention | 85 | 124 | 404 | 127 | 108 | 1108 | 105 | 171 | 5473 | nA |
| power | 27 | 30 | 72 | 33 | 20 | 178 | 21 | 27 | 830 | nW |

(602)

VOLTAGE REGULATOR FOR GENERATION OF A VOLTAGE FOR A RAM CELL

TECHNICAL FIELD

The present disclosure relates to a voltage regulator for the generation of a retention voltage for a RAM cell to prevent data loss. In particular, this disclosure relates to generation of a RAM retention voltage that enables low power consumption in the RAM cell sleep mode.

BACKGROUND

Figure 1:
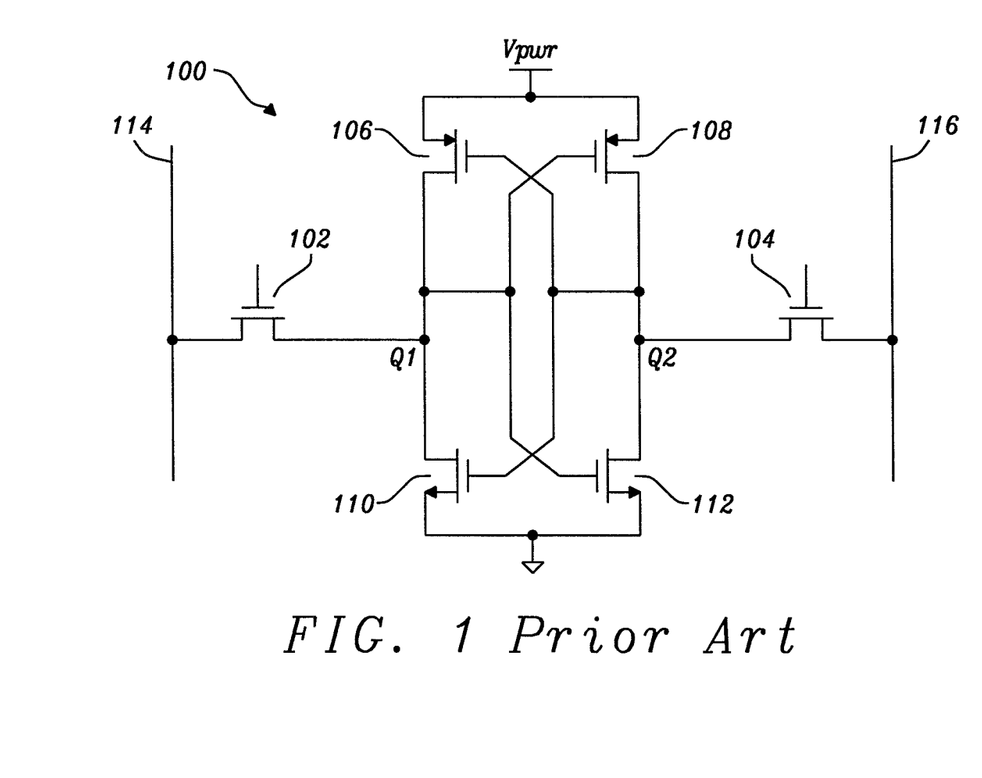
FIG. 1 is a schematic of a random access memory (RAM) cell in accordance with the prior art.

FIG. 1 shows a random access memory (RAM) cell 100 for storing data. In a sleep mode, a supply voltage Vpwr of the RAM cell 100 is reduced compared to its value during normal operation conditions. This is to reduce the occurrence of leakage currents which can waste power. This is particularly significant in a practical RAM array, which may comprise 64 thousand, or even 512 thousand RAM cells 100. RAM cells 100 may, for example, be used in Bluetooth chips. The sleep mode may also be referred to as a standby mode.

The reduced supply voltage Vpwr during sleep mode may be referred to as a retention voltage. It is necessary that the retention voltage is sufficiently high to prevent the loss of data. However, usually the retention voltage is set higher than necessary, which results in power inefficiency during the sleep mode due to leakage currents and leads to reduced battery lifetime.

SUMMARY

It is an object of this disclosure to provide a voltage regulator for generating a retention voltage for a RAM cell that is sufficiently high to prevent data loss, whilst minimising leakage currents.

According to a first aspect of the disclosure there is provided a voltage regulator for generating at least one voltage, comprising mirror circuitry, a leakage device coupled to the mirror circuitry, and a first resistive device coupled to the mirror circuitry via a first output node, wherein the mirror circuitry mirrors a leakage current from the leakage device to the first resistive device, and the leakage current contributes to the generation of a first reference voltage at the first output node.

Optionally, the voltage regulator comprises a second resistive device coupled to the mirror circuitry via a second output node, wherein the mirror circuitry mirrors the leakage current from the leakage device to the second resistive device, and the leakage current contributes to the generation of a second reference voltage at the second output node.

Optionally, an output voltage that is output by the voltage regulator corresponds to one of the first reference voltage and the second reference voltage.

Optionally, the output voltage corresponds to the greater of the first reference voltage and the second reference voltage.

Optionally, the mirror circuitry comprises a current mirror, the current mirror comprising a plurality of current mirror transistors.

Optionally, the mirror circuitry comprises a leakage transistor that is arranged to provide an additional leakage current to the first resistive device, and the additional leakage current contributes to the generation of the first reference voltage at the first output node.

Optionally, the leakage transistor is in an off state.

Optionally, the leakage device comprises one or more leakage transistors.

Optionally, the or each leakage transistor is in an off state.

Optionally, the one or more leakage transistors comprises a first and second leakage transistor coupled in parallel.

Optionally, the voltage regulator comprises a unity gain buffer, wherein the first reference voltage is received by an input of the unity gain buffer, and an output of the unity gain buffer outputs an output voltage.

Optionally, the first resistive device comprises a resistive transistor.

Optionally, the first reference voltage is a gate-source voltage of the first resistive transistor.

Optionally, the first resistive transistor is diode connected.

Optionally, the leakage device is configured to have a leakage current greater than a leakage current of an associated leakage device of a RAM cell.

Optionally, the first reference voltage is adaptive to temperature variations and/or process corners.

According to a second aspect of the disclosure there is provided an apparatus comprising a RAM cell for storing data and arranged to receive a retention voltage, and a voltage regulator for generating a retention voltage that is sufficiently high to prevent loss of data in the RAM cell, wherein the voltage regulator comprises mirror circuitry, a leakage device coupled to the mirror circuitry, and one or more resistive devices coupled to the mirror circuitry, the or each resistive device having an output node and the or each resistive device being coupled to the mirror circuitry via their respective output nodes, wherein the mirror circuitry mirrors a leakage current from the leakage device to the or each resistive device, and the leakage current contributes to the generation of a reference voltage at the or each output node, and the retention voltage is provided by the or one of the reference voltages.

According to a third aspect of the disclosure there is provided a method of generating a first reference voltage, comprising mirroring a leakage current from a leakage device to a first resistive device, and generating a first reference voltage at a first output node associated with the first resistive device, the first reference voltage being generated at least partly from the leakage current mirrored to the first resistive device.

Optionally, the method is for generating a retention voltage for a RAM cell, comprising mirroring the leakage current from the leakage device to a second resistive device, generating a second reference voltage at a second output node associated with the second resistive device, the second reference voltage being generated at least partly from the leakage current mirrored to the second resistive device, and providing one of the reference voltages to the RAM cell as the retention voltage.

BRIEF DESCRIPTION OF THE DRAWINGS

The disclosure is described in further detail below by way of example and with reference to the accompanying drawings, in which.

is a schematic of a voltage regulator in accordance with a second embodiment of this disclosure.

DETAILED DESCRIPTION

FIG. 1 shows a random access memory (RAM) cell 100 for storing data. The RAM cell 100 comprises two read/write transistors 102, 104; two p-type transistors 106, 108; and two n-type transistors 110, 112. It will be appreciated that the transistor types may be changed in accordance with the understanding of the skilled person.

Data may be stored at nodes Q1 and Q2, and data may be stored in one of the following two states: Q1=1 and Q2=0; or Q1=0 and Q2=1. The numbers "1" and "0" denote a high logic state and a low logic state, respectively. A high logic state may correspond to a node being at a supply voltage Vpwr and a low logic state may correspond to a node being at a ground voltage.

The RAM cell 100 comprises data lines 114, 116. A read/write signal provided to gates of the read/write transistors is used to switch the RAM cell 100 to a read or write mode. In a read mode, the data stored at the nodes Q1, Q2 is provided to their respective data lines 114, 116. In write mode, data received at the data lines 114, 116 is provided to their respective nodes Q1, Q2 and stored.

The RAM cell 100 may be in a sleep mode where the supply voltage Vpwr is reduced compared to its value when in the read or write mode. The reduction of the supply voltage Vpwr is to reduce the leakage currents and therefore to reduce the power consumption of the circuit when in the sleep state.

In the off state, the transistor may be referred to as being in the subthreshold region, where a gate-source voltage of the transistor is below its threshold voltage. It is possible, in the off state, for a leakage current (which may be referred to as a subthreshold current) to flow between the source and drain terminals of the transistor. In the off state, there should ideally be no current flow and therefore leakage current wastes power and is undesirable. As mentioned previously, it is possible to reduce leakage current from the transistors 102, 104, 106, 108, 110, 112 by reducing the supply voltage Vpwr in the sleep state.

However, it still necessary that there is a sufficiently large supply voltage Vpwr to for the RAM cell to hold the data at the nodes Q1, Q2. If the supply voltage Vpwr is too small, then data held at the nodes Q1, Q2 may be lost.

Therefore, to summarise, in sleep mode it is desirable that the RAM cell 100 supply voltage Vpwr is sufficiently high to hold the data, and is sufficiently small to minimise leakage currents.

The size of the transistors 102, 104, 106, 108, 110, 112 can impact the leakage currents and the leakage current may be reduced by providing specific transistor widths (W) and lengths (L). Generally speaking, a smaller width W results in smaller leakage currents and a larger length L results in smaller leakage currents. Leakage current may be referred to as channel leakage.

Design rules dictate the minimum channel width (Wmin) and the minimum channel length (Lmin) values associated with transistor sizes. It is desirable for a RAM cell to have a small size, with widths W and lengths L close to the minimum values set by the design rules. In RAM cells it is possible for there to be an exception to the minimum width Wmin design rule, such that a RAM cell's width may be smaller than the minimum width Wmin. For example, assuming a minimum width of Wmin, the transistors may have the following widths: read/write transistors may have widths W that are equal to 0.8 times the minimum width Wmin; p-type transistors 106, 108 may have widths W that are equal to 0.6 times the minimum width Wmin; and n-type transistors 110, 112 may have widths W that are equal to the minimum width Wmin. Assuming a minimum length of Lmin, the transistors 102, 104, 106, 108, 110, 112 may have a length L equal to 1.2 times the minimum length Lmin. Therefore, the length L is larger than the minimum Lmin, to reduce channel leakage.

The transistors 102, 104, 106, 108, 110, 112 may also have a high threshold voltage, high Vt (HVT), to minimise their leakage currents. The HVT is created by a voltage threshold implant layer. Having a HVT means that there is less leakage current in the transistor off state however it also means that the retention voltage must be higher to avoid data loss.

Figure 2:
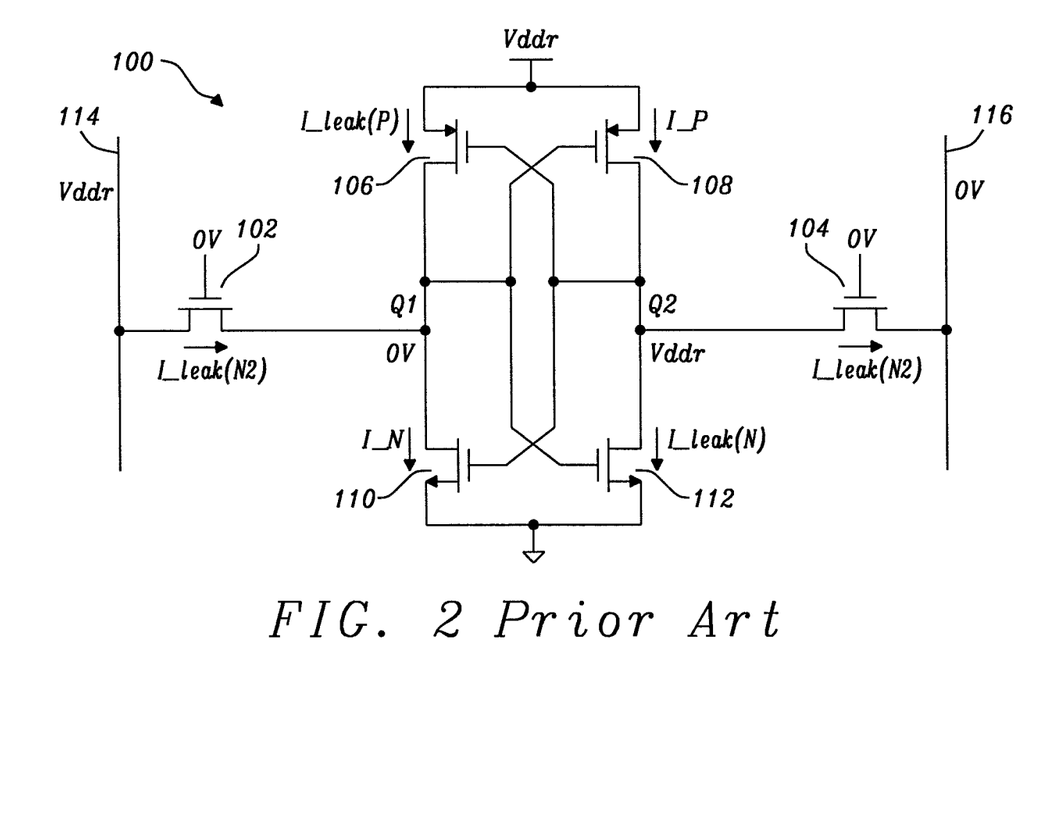
FIG. 2 is a schematic of the RAM cell of FIG. 1 in a configuration with currents shown.

FIG. 2 shows the RAM cell 100 in a "worst case" where the leakage currents are highest. The supply voltage Vpwr as shown in FIG. 1 is now equal to a retention voltage Vddr as shown in FIG. 2. The supply voltage Vpwr will be represented by the retention voltage Vddr, when the RAM cell 100 is in a sleep mode. The data line 114 is coupled to the retention voltage Vddr and the data line 116 is coupled to ground, which may be labelled as 0V. The node Q1 is at 0V and the node Q2 is at Vddr. Each of the gates of the read/write transistors 102, 104 are at 0V.

The p-type transistor 108 and the n-type transistor 110 are in an on state and therefore permit current flow. A current I_P flows through the p-type transistor 108 and a current I_N flows through the n-type transistor 110. The remaining transistors 102, 104, 106, 112 are in off states. Leakage currents flow through the remaining transistors 102, 104, 106, 112. Leakage currents flowing through each of the read/write transistors 102, 104 are equal and labelled as I_leak(N2). A leakage current I_leak(P) flows through the p-type transistor 106 and a leakage current I_leak(N) flows through the n-type transistor 112. In the present configuration transistors 108, 110 may be referred to as on-state transistors and transistors 102, 104, 106, 112 may be referred to as off-state transistors.

To hold node Q1 at 0V it is necessary that a drain source resistance Rds_ON(110) of the transistor 110 in its on state is much less than the resistance of the parallel combination of drain source resistances of transistor 102 Rds_OFF(102) and transistor 106 Rds_OFF(106) in their off states. This condition ensures that Q1 is "pulled down" close to 0V, and may be denoted by the following inequality:

$$\text{Rds\_ON}(110) \ll \cfrac{1}{\cfrac{1}{\text{Rds\_OFF}(102)} + \cfrac{1}{\text{Rds\_OFF}(106)}}$$

Rds_ON(110) may, for example, be ten times smaller than the resistance of the parallel combination of Rds_OFF(102) and Rds_OFF(106).

A similar condition applies in holding node Q2 at the retention voltage Vddr, where it is necessary that a drain source resistance Rds_ON(108) of the transistor 108 in its on state is much less than the resistance of the parallel combination of drain source resistances of transistor 104 Rds_OFF(104) and transistor 112 Rds_OFF(112) in their off states. This conditions ensures that Q2 is "pulled up" close to the retention voltage Vddr, and may be denoted by the following inequality.

$$\text{Rds\_ON}(108) \ll \cfrac{1}{\cfrac{1}{\text{Rds\_OFF}(104)} + \cfrac{1}{\text{Rds\_OFF}(112)}}$$

Rds_ON(108) may, for example, be ten times smaller than the resistance of the parallel combination of Rds_OFF(104) and Rds_OFF(112).

"Pull up" is used to describe raising a node to a higher voltage and "pull down" is used to describe lowering a node to a lower voltage.

In terms of the currents in the RAM cell 100, the above conditions to hold data at the nodes Q1, Q2 and to prevent data loss is as follows: I_P must be much greater than the sum of I_leak(N) and I_leak(N2): (I_P>>I_leak(N)+Ileak(N2)); and I_N must be much greater than the sum of I_leak(P) and I_leak(N2): (I_N>>I_leak(P)+I_leak(N2)).

If the above conditions are not met, then there may be data loss. For example, consider I_leak(N) and/or I_leak(N2) being sufficiently large to "pull down" the node Q2 from the retention voltage Vddr to a lower voltage. This will lower the gate source voltage of the transistor 110 such that Rds_ON(110) will increase and similarly Rds_ON(108) will increase. As illustrated by the above inequalities, this can lead to data loss.

Preferably, to prevent data loss, the gate-source voltage of each of the p-type transistor 108 and the n-type transistor 110 will be equal to the retention voltage Vddr.

The above requirements for holding data may be met when the p-type transistor 108 and the n-type transistor 110 are operating in their very deep sub threshold regions.

A transistor is traditionally defined as being in an on state when its gate source voltage (Vgs) is much greater than its threshold voltage (Vth): Vgs>Vth; or in an off state when its gate source voltage Vgs is much less than its threshold voltage Vth: Vgs<Vth.

However, in reality, a transistor may operate in the very deep subthreshold region where the transistor is in an on state when Vgs<Vth. In the very deep subthreshold region the gate source voltage is much less than the threshold voltage (Vgs<<Vth), but the gate source voltage Vgs is just high enough to switch the transistor to an on state and enable current flow.

The gate source voltages of the transistor 108, 110 are dependent on the retention voltage Vddr. If the retention voltage Vddr is too low, the transistors 108, 110 will not operate in their very deep subthreshold regions and simply be in the off state. In this case data loss will occur. Therefore, to prevent data loss, the retention voltage Vddr must be high enough to keep both transistors 108, 110 in the on state.

It will be appreciated that in another RAM cell configuration, where Q1 is at the retention voltage Vddr and Q2 is at 0V, there is another "worst case" (where leakage currents are highest) when the data line 114 is at 0V and the data line 116 is at the retention voltage Vddr. In this case the transistors 106, 112 will be in on states and transistors 108, 110 will be in off states and the following conditions are required to prevent data loss:

$$\text{Rds\_ON}(106) \ll \cfrac{1}{\cfrac{1}{\text{Rds\_OFF}(102)} + \cfrac{1}{\text{Rds\_OFF}(110)}}$$

and $$\text{Rds\_ON}(112) \ll \cfrac{1}{\cfrac{1}{\text{Rds\_OFF}(104)} + \cfrac{1}{\text{Rds\_OFF}(108)}}$$

In this configuration, transistors 106, 112 may be referred to as on-state transistors, and transistors 102, 104, 108, 110 may be referred to as off-state transistors.

The following description will be provided for the configuration of the RAM cell 100 in FIG. 2, however it will be clear to the skilled person how this disclosure relates to the other configuration, where Q1 is at the retention voltage Vddr and Q2 is at 0V.

Figure 3:
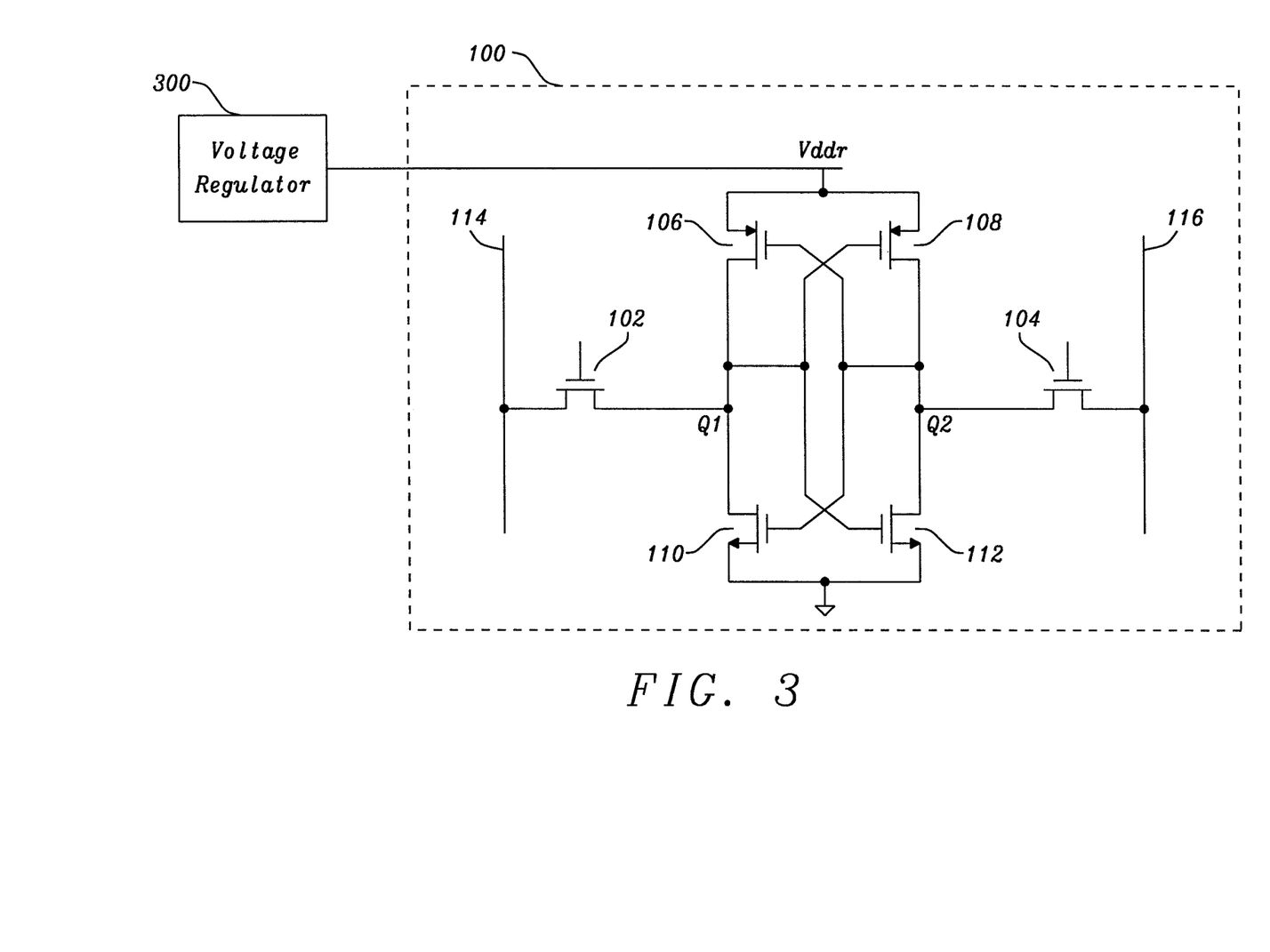
FIG. 3 is a schematic of a voltage regulator coupled to the RAM cell of FIG. 1.

FIG. 3 shows a voltage regulator 300 for generating a retention voltage Vddr. The retention voltage Vddr may be provided to the RAM cell 100. The voltage regulator 300 may be a low dropout regulator (LDO).

The RAM cell 100 is configured to store data. The voltage regulator 300 is configured to generate a retention voltage Vddr that is sufficiently high to prevent loss of data in the RAM call 100.

The present disclosure relates to a voltage regulator for generation of a retention voltage that is sufficiently high to prevent data loss in one or more RAM cells and also sufficiently low to minimise leakage currents in the or each RAM cell.

In particular, the retention voltage Vddr that is generated is sufficiently low to minimise the leakage currents but also sufficiently high to operate the transistors 108, 110 in their very deep subthreshold regions whilst meeting the following conditions:

$$\text{Rds\_ON}(110) \ll \cfrac{1}{\cfrac{1}{\text{Rds\_OFF}(102)} + \cfrac{1}{\text{Rds\_OFF}(106)}}$$

and $$\text{Rds\_ON}(108) \ll \cfrac{1}{\cfrac{1}{\text{Rds\_OFF}(104)} + \cfrac{1}{\text{Rds\_OFF}(112)}}$$

Therefore, the retention voltage Vddr is kept to a minimum, to minimise leakage currents, but is also of a sufficiently high value to prevent loss of data.

In terms of current flow, the voltage regulator 300 may control the retention voltage Vddr precisely to the point where the transistors in an on state enable greater current flow than the leakage currents of the associated off state transistors. For example, to prevent data loss in the RAM cell 100 configuration of FIG. 2, it is required that I_P must be much greater than the sum of I_leak(N) and I_leak(N2.)

Figure 4A:
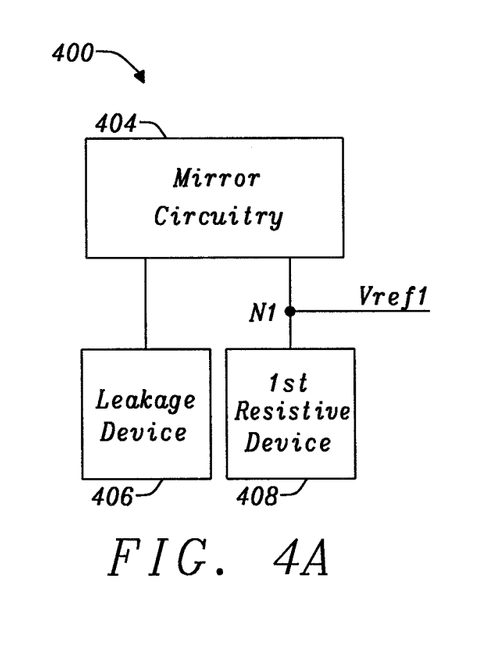
FIG. 4(A) is a schematic of a voltage regulator in accordance with a first embodiment of this disclosure, FIG. 4(B)
Figure 4B:
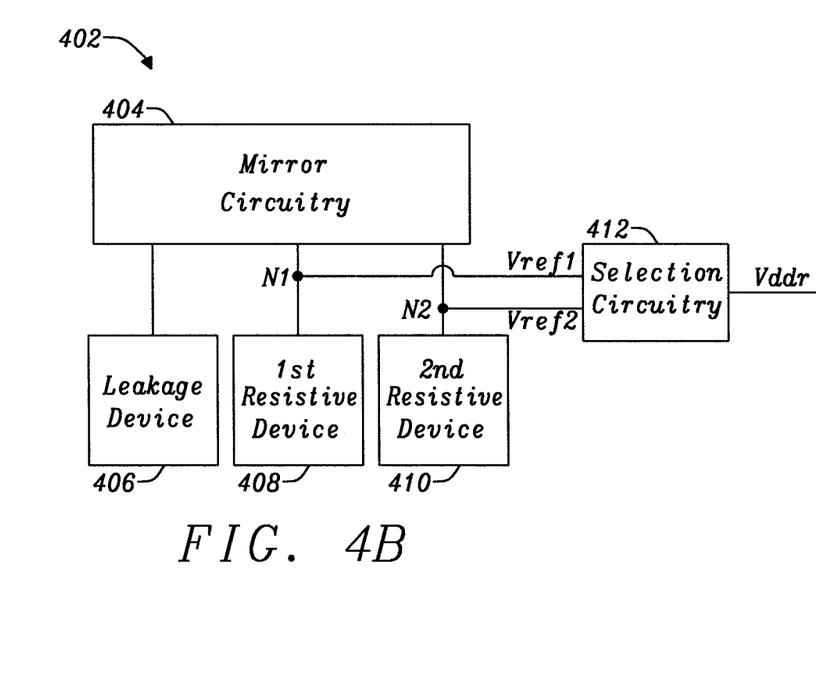

FIG. 4(A) shows a voltage regulator 400 and FIG. 4(B) shows a voltage regulator 402 according to first and second embodiments of the present disclosure, respectively. Either of the voltage regulators 400, 402 may correspond to the voltage regulator 300 and are both suitable for generating a retention voltage Vddr that may be provided to the RAM cell 100.

The RAM cell 100 may be a static RAM cell, for example a fully static 6T type cell. A RAM cell may be provided as an IP block. The voltage regulators 300, 400, 402 may be referred to as low dropout (LDO) regulators.

The voltage regulator 400 comprises mirror circuitry 404; a leakage device 406 that is coupled to the mirror circuitry 404; a resistive device 408 that is coupled to the mirror circuitry 404 via an output node N1. The mirror circuitry 404 mirrors a leakage current from the leakage device 406 to the resistive device 408.

Leakage current may arise due to channel leakage, junction leakage or gate leakage. In nanometer technologies, channel leakage is the most dominant of these three sources of leakage current. A leakage device is a device that enables a leakage current to flow. This may, for example, correspond to current flow when the leakage device is in an off state.

The leakage current contributes to the generation of a reference voltage Vref1 at the output node N1. By "contributes", it is meant that either the leakage current on its own results in the generation of the reference voltage Vref1, or alternatively that the leakage current and one or more other currents results in the generation of the reference voltage Vref1. The reference voltage Vref1 may be provided to the RAM cell 100 as the retention voltage Vddr.

For FIG. 4(A), a method of generating the retention voltage Vddr may be described as follows. There is a first step of mirroring the leakage current from the leakage device 406 to the resistive device 408. There is a second step of generating the reference voltage Vref1, at least partly, from the leakage current mirrored to the resistive device 408. There is a third step of providing the reference voltage Vref1 to the RAM cell 100 at the retention voltage Vddr.

The voltage regulator 402 corresponds to the voltage regulator 400 but the voltage regulator 402 further comprises: a second resistive device 410 and selection circuitry 412. The second resistive device 410 is coupled to the mirror circuitry 404 via a second output node N2. Common features between drawings are represented by common reference numerals and variables.

The resistive device 408 may be referred to as the first resistive device 408 and the output node N1 may be referred to as the first output node N1. The reference voltage Vref1, which may be referred to as the first reference voltage Vref1, is generated as described in the voltage regulator 400.

A second reference voltage Vref2 is generated as follows. The mirror circuitry 404 mirrors the leakage current from the leakage device 406 to the second resistive device 410. The leakage current contributes to the generation of the second reference voltage Vref2 at the second output node N2.

It will be appreciated that the use of "first" and "second" in labelling the resistive devices 408, 410, their associated components, and their reference voltages Vref1, Vref2 is intended to be non-limiting. For example, the first resistive device 408 may alternatively be referred to as "a second resistive device", and the second resistive device 410 may alternatively be referred to as "a first resistive device".

Each of the reference voltages Vref1, Vref2 is provided to the selection circuitry 412 and one of the reference voltages Vref1, Vref2 is output as the retention voltage Vddr. The selection circuitry 412 may, for example, output the greater of the reference voltages Vref1, Vref2 as the retention voltage Vddr. Alternatively, the selection circuitry 412 may output the smallest of the reference voltages Vref1, Vref2 as the retention voltage Vddr. Prior to outputting the retention voltage Vddr, the selection circuitry 412 may apply further processing to the selected reference voltage Vref1, Vref2, as will be discussed in further detail below.

For FIG. 4(B) a method of generating the retention voltage Vddr may be described as follows. There is a first step of mirroring the leakage current from the leakage device 406 to the first resistive device 408. There is a second step of generating the first reference voltage Vref1, at least partly, from the leakage current mirrored to the first resistive device 408.

There is a third step of mirroring the leakage current from the leakage device 406 to the second resistive device 410. There is a fourth step of generating the second reference voltage Vref2, at least partly, from the leakage current mirrored to the second resistive device 410. There is a fifth step of providing one of the first reference voltage Vref1 and the second reference voltage Vref2 to the RAM cell 100 as the retention voltage Vddr.

Figure 5:
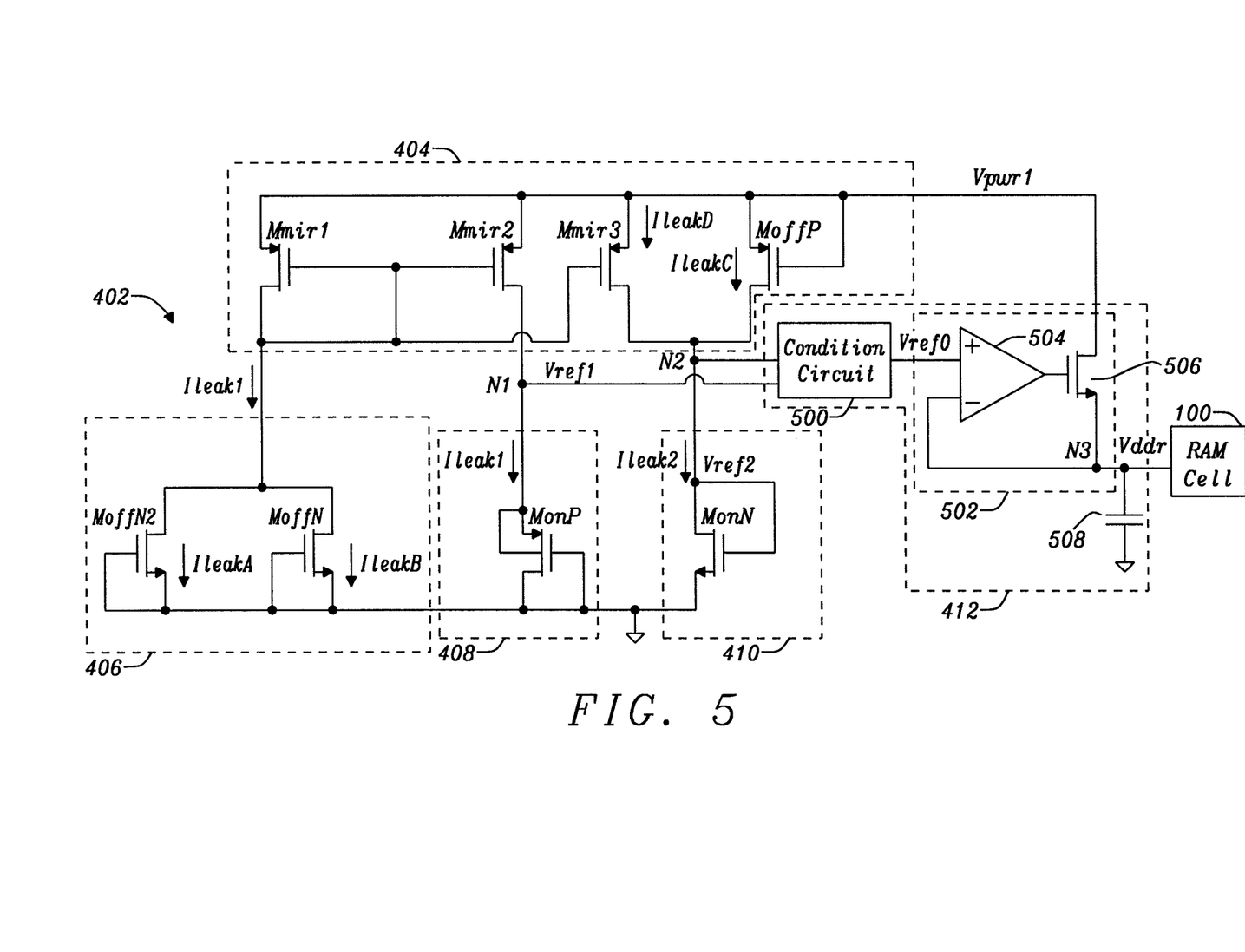
FIG. 5 is a schematic of the voltage regulator of FIG. 4(B) with specific circuit implementations.

FIG. 5 shows a schematic of the voltage regulator 402 with specific implementations of the mirror circuitry 404, the leakage device 406, the first resistive device 408, the second resistive device 410 and the selection circuitry 412. Also shown is the RAM cell 100.

It will be clear to the skilled person how the specific implementations of the mirror circuitry 404, the leakage device 406 and the first resistive device 408 may be implemented in the voltage regulator 400 of FIG. 4(A).

The selection circuitry 412 comprises a condition circuit 500. The condition circuit 500 may implement one of the features as previously described for the selection circuitry 412, for example selection of the largest or smallest of the two reference voltages Vref1, Vref2. In this particular embodiment, the largest of the reference voltages Vref1, Vref2 is output by the condition circuit 500 as the selected reference voltage Vref0.

As mentioned previously, there may be further processing of the selected reference voltage Vref0. In this particular embodiment the selected reference voltage Vref0 is provided to an input of a unity gain buffer 502. The unity gain buffer 502 comprises an op amp 504 and a transistor 506. The selected reference voltage Vref0 is provided to a positive input of the op amp and an output of the op amp 504 is provided to a gate of the transistor 506. A drain of the transistor 506 is coupled to a supply voltage Vpwr1 and a source of the transistor 506 is coupled to a negative input of the op amp 504. The supply voltage Vpwr1 may correspond to the supply voltage Vpwr of the RAM cell 100 as previously described, when the RAM cell 100 is in a read or write mode, as opposed to the sleep mode.

The source of the transistor 506 is coupled to a first terminal of a capacitor 508 at an output node N3. The capacitor 508 has a second terminal coupled to ground. The unity gain buffer 502 outputs the retention voltage Vddr at the output node N3. The output node N3 may be coupled to the RAM cell 100.

By selecting the largest of the reference voltages Vref1, Vref2, it ensures that the resultant retention voltage Vddr is sufficiently high to ensure both on-state transistors (for example 108, 110) of the RAM cell 100 are on.

The mirror circuitry 404 comprises a current mirror, the current mirror comprises a plurality of current mirror transistors. In the present embodiment the plurality of current mirror transistors comprises a first, second and third current mirror transistor Mmir1, Mmir2, Mmir3.

The leakage device 406 comprises a first leakage transistor MoffN2 and a second leakage transistor MoffN. The leakage transistors MoffN2, MoffN are coupled in parallel and have their gate and source terminals coupled to ground. Their drain terminals are coupled the supply voltage Vpwr1 via the first current mirror transistor Mmir1.

The leakage transistors MoffN2, MoffN are in an off state. A leakage current IleakA flows through the first leakage transistor MoffN2 and a leakage current IleakB flows through the second leakage transistor MoffN. A leakage current Ileak1, which is the sum of the leakage currents IleakA and IleakB, flows through the first current mirror transistor Mmir1.

The first resistive device 408 comprises a resistive transistor MonP. A gate of the resistive transistor MonP is coupled to its drain and therefore the resistive transistor MonP may be said to be diode connected.

The configuration of the current mirror formed by the first current mirror transistor Mmir1 and the second current mirror transistor Mmir2 results in the leakage current Ileak1 being mirrored to the resistive transistor MonP. In this specific embodiment, the first reference voltage Vref1 is generated across the gate and drain terminals of the resistive transistor MonP due to the leakage current Ileak1.

The leakage current Ileak1 has been generated by a parallel combination of the transistors MoffN2 and MoffN, however it will be appreciated that a single transistor, which may be in an off state, or more than two transistors, which may be in an off state and arranged in parallel and/or series combinations, may also be used to generate a suitable leakage current.

The mirror circuitry 404 further comprises a third leakage transistor MoffP that is in an off state. A leakage current IleakC, which may be referred to as an additional leakage current, flows through the third leakage transistor MoffP. The second resistive device 410 comprises a resistive transistor MonN. A gate of the resistive transistor MonN is coupled to its drain and therefore the resistive transistor MonN may be said to be diode connected.

The configuration of the current mirror formed by the first current mirror transistor Mmir and the third current mirror transistor Mmir3 results in the leakage current Ileak1 being mirrored to the resistive transistor MonN. In mirroring of the leakage current Ileak1 to the resistive transistor, the leakage current Ileak1 is halved and is represented on FIG. 5 by a leakage current IleakD which is equal to half the leakage current Ileak1.

It will be appreciated by the skilled person that a mirrored current may be scaled compared to an original current, for example as described above, and still be referred to as mirroring of the original current.

The parallel coupling of the current mirror transistor Mmir3 and the third leakage transistor MoffP means that a leakage current Ileak2, that is the sum of the leakage current IleakC and IleakD, is provided to the resistive transistor MonN. In this specific embodiment, the second reference voltage Vref2 is generated across the gate and drain terminals of the resistive transistor MonN due to the leakage current Ileak2.

The paths of the leakage currents of the RAM cell 100 are "replicated" by the transistors MoffN2, MoffN2, MoffP in the off state and provided to the diode connected transistors MonP, MonN. The leakage currents Ileak1 and Ileak2 drive the transistors MonP and MonN, respectively, in their very deep subthreshold regions, where their gate-source voltages are smaller than their threshold voltages. The gate-source voltage of the transistor MonP is the reference voltage Vref1, which is below the threshold voltage of the transistor MonP; and the gate-source voltage of the transistor MonN is the reference voltage Vref2, which is below the threshold voltage of the transistor MonN.

In this specific embodiment, the widths of the current mirror transistors Mmir1, Mmir2, Mmir3 are equal to the minimum width Wmin, as defined previously for the RAM cell 100. The lengths of the current mirror transistors Mmir1, Mmir2, Mmir3 are much greater than the minimum length Lmin. The length of the third current mirror transistor Mmir3 is equal to twice the length of the second current mirror transistor Mmir2. It will be appreciated that in further embodiments, the transistors may be sized differently, in accordance with the understanding of the skilled person. For example, the third current mirror transistor Mmir3 may have a length that is greater than or less than twice the length of the second current mirror transistor Mmir2.

Each of the transistors MoffN2, MoffN, MoffP, MonP, MonN have an associated RAM cell 100 transistor 102, 104, 106, 108, 110, 112. The first leakage transistor MoffN2 is associated with any one of the read/write transistors 102, 104; the second leakage transistor MoffN is associated with the n-type transistor 112; the third leakage transistor MoffP is associated with the p-type transistor 106; the resistive transistor MonP is associated with the p-type transistor 108; and the resistive transistor MonN is associated with the n-type transistor 110.

When the transistors MoffN2, MoffN, MoffP, MonP, MonN are of equal size to their associated RAM cell 100 transistors 102, 104, 106, 108, 110, 112 the currents flowing through each of the transistors MoffN2, MoffN, MoffP, MonP, MonN are equal to the currents flowing through their associated RAM cell 100 transistors 102, 104, 106, 108, 110, 112. In this case: IleakA is equal to I_leak(N2); IleakB is equal to Ileak(N); Ileak1 is equal to Ileak(N2) plus Ileak(N); IleakC is equal to IleakP; IleakD is equal to Ileak(N2); and Ileak2 is equal to Ileak(P) plus Ileak(N2).

As discussed above, the leakage current IleakD is equal to half the leakage current Ileak1. This results from the length of the third current mirror transistor Mmir3 being equal to twice the length of the second current mirror transistor Mmir2. Half of Ileak1 is approximately equally to Ileak (N2).

In this case, the reference voltage Vref1, generated by the leakage current Ileak1 received by the resistive transistor MonP, provides a retention voltage Vddr that results in the current I_P equal to Ileak(N2) plus Ileak(N) for the p-type transistor 108.

In this case, the reference voltage Vref2, generated by the leakage current Ileak2 received by the resistive transistor MonN, provides a retention voltage Vddr that results in the current I_N equal to Ileak(P) plus Ileak(N2) for the n-type transistor 110.

When the transistors MoffN2, MoffN, MoffP, MonP, MonN are of equal size to their associated RAM cell 100 transistors 102, 104, 106, 108, 110, 112 the following condition is true: I_P=Lleak(N)+Ileak(N2); and I_N=Lleak(P)+I_leak(N2). This means that the retention voltage Vddr output by the voltage regulator 402 and provided to the RAM cell 100, will be at the exact value where the RAM cell 100 loses data. Therefore, in a practical implementation it is necessary that the retention voltage Vddr is sufficiently high to prevent minor fluctuations in the retention voltage Vddr resulting in lost data.

A retention voltage Vddr, having a suitable voltage margin above the exact value where the RAM cell 100 loses data, will be provided when the following conditions, as described previously, are met:

$$\text{Rds\_ON}(110) \ll \frac{1}{\frac{1}{\text{Rds\_OFF}(102)} + \frac{1}{\text{Rds\_OFF}(106)}}$$

-continued $$Rds\_ON(108) \ll \cfrac{1}{\cfrac{1}{Rds\_OFF(104)} + \cfrac{1}{Rds\_OFF(112)}}$$

The retention voltage Vddr may be altered by changing the size of the transistors MoffN2, MoffN, MoffP, MonP, MonN. The size may be changed by altering the ratio of a transistor's width W to its length L. The ratio between W and L for a transistor may be referred to as the W/L ratio. Decreasing the W/L ratio of the transistors MoffN2, MoffN, MoffP, MonP and MonN increases the voltage margin.

By appropriately sizing the transistors MoffN2, MoffN, MoffP, MonP, MonN it is possible to have: IleakA greater than I_leak(N2); IleakB greater than Ileak(N); Ileak1 greater than Ileak(N2) plus Ileak(N); IleakC greater than Ileak(P); IleakD is equal to Ileak(N2); and Ileak2 greater than Ileak(P) plus Ileak(N2). The skilled person will be aware of the technology and will be able to size the transistors appropriately.

The leakage currents of the transistors MoffN2, MoffN, MoffP in the voltage regulator 402 may, for example, be ten times greater than the associated leakage currents of the transistors 102, 104, 106, 112 of the RAM cell 100. For example, IleakA may be ten times greater than I_leak(N2).

In this case, the reference voltage Vref1, generated by the leakage current Ileak1 received by the resistive transistor MonP, provides a retention voltage Vddr that results in the current I_P greater than Lleak(N) plus Ileak(N2) for the p-type transistor 108.

In this case, the reference voltage Vref2, generated by the leakage current Ileak2 received by the resistive transistor MonN, provides a retention voltage Vddr that results in the current I_N greater than I_leak(P) plus I_leak(N2) for the n-type transistor 110.

The following required conditions are then true: I_P>>I_leak(N)+Ileak(N2); and I_N>>I_leak(P)+I_leak(N2), which may also be represented by $$Rds\_ON(110) \ll \cfrac{1}{\cfrac{1}{Rds\_OFF(102)} + \cfrac{1}{Rds\_OFF(106)}}$$

and $$Rds\_ON(108) \ll \cfrac{1}{\cfrac{1}{Rds\_OFF(104)} + \cfrac{1}{Rds\_OFF(112)}}$$

and there is provided a suitable retention voltage Vddr for preventing data loss.

In practical applications, a voltage margin of approximately 50 mV, such that the retention voltage Vddr is 50 mV above the exact value where the RAM cell 100 loses data is likely to be sufficient to overcome any mismatch between the transistors MoffN2, MoffN, MoffP, MonP, MonN and their associated RAM cell 100 transistors 102, 104, 106, 108, 110, 112. The voltage margin may be adjustable by a user, thereby ensuring that there is no data loss under different conditions. For example, a voltage margin of approximately 40 mV may also be suitable.

In the specific implementation shown in FIG. 5, a retention voltage Vddr is generated, at least partly, using leakage currents IleakA, IleakB, IleakC provided by transistors MoffN2, MoffN, MoffP in their off states to generate reference voltages Vref1 and Vref2 over transistors MonP and MonN, respectively, where MonP and MonN are MOS transistors in diode connected configurations. The retention voltage Vddr may be provided by one of the reference voltage Vref1, Vref2.

Voltage transients between read or write mode and sleep mode need to be sufficiently smooth to ensure that data is not lost in the RAM cell 100. In a practical system a transition time of 10 µs where the supply voltage Vpwr linearly changes from Vpwr1 for the read or write mode to the retention voltage Vddr for the sleep mode, and vice versa, is likely to be suitable. Voltage overshoots and undershoots must be avoided as the RAM cell may lose data if critical levels are exceeded.

It will be appreciated that the voltage regulator 402 of FIG. 5 may be used to generate a retention voltage Vddr for an array of RAM cells of the type shown in FIGS. 1 and 2.

Figure 6A:
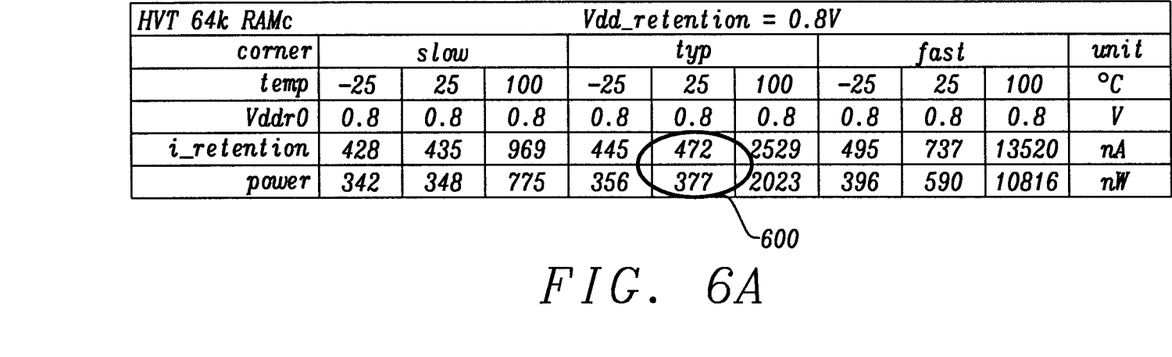
FIG. 6(A) is a table of simulation results for a RAM array with a fixed retention voltage and FIG. 6(B) is a table of simulations results for a RAM array with an adaptive retention voltage, the adaptive retention voltage being provided by the voltage regulator of FIG. 4(B).

FIG. 6(A) shows simulation results of a RAM array comprising 64 thousand RAM cells 100, where each RAM cell has a fixed retention voltage Vddr0. The simulated RAM cells 100 have widths (W) and lengths (L) as described previously. Additionally, HVT transistors were used in the simulations.

Figure 6B:
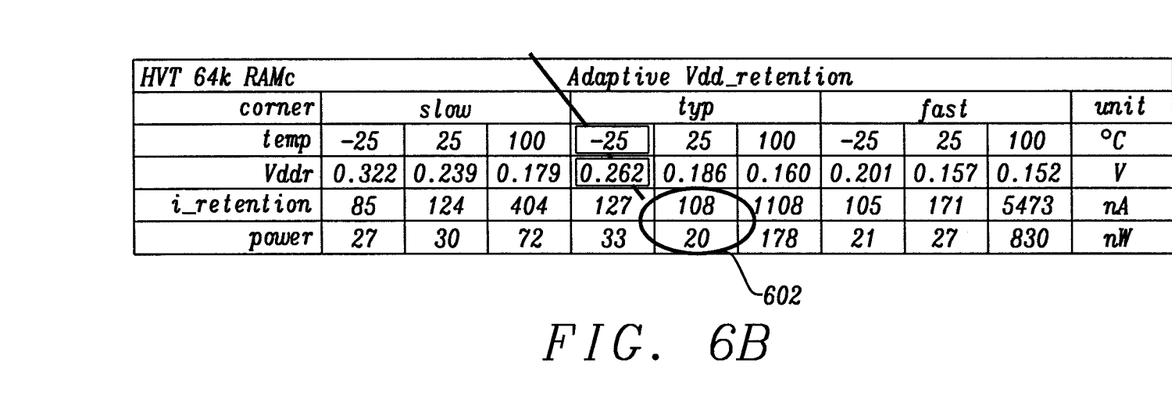

FIG. 6(B) shows simulation results of a RAM array comprising 64 thousand RAM cells 100, where each RAM cell has a retention voltage Vddr provided by the voltage regulator 402 as shown in FIG. 5. The voltage regulator 402 provides an adaptive retention voltage that varies for varying processing corners (shown for slow, typical (typ) and fast) and temperatures (shown for −25° C., 25° C. and 100° C.). Also shown are current retention (i_retention) and power consumption (power). Current retention (i_retention) is the current consumption of the 64 thousand RAM cells 100 whilst in the sleep mode.

The processing corners refer to the extremes of transistor switching speeds and are usually provided by manufacturers. Slow and fast refer to the slowest and fastest switching speeds, respectively, that are guaranteed by a given manufacturer. Typical (typ) is the typical transistor switching speed.

Generally speaking a transistor with a higher switching speed has greater leakage current than a transistor with a lower switching speed. Also, generally speaking, a higher temperature results in a lower threshold voltage of a transistor and therefore greater leakage current when compared to operation at a lower temperature.

By having an adaptive retention voltage Vddr that varies with processing corners and temperature, the retention voltage Vddr may be kept as low as possible for different operating conditions, whilst still preventing data loss. The adaptive retention voltages Vddr shown in FIG. 6(B) are sufficiently low to operate the on-state transistors of the RAM cells 100 in their very deep subthreshold regions.

By comparing a first circled region 600 with a second circled region 602 it can be seen that at room temperature (25° C.) with a nominal processing corner (typ), the RAM array of FIG. 6(A) requires 4.5 times more retention current and 18 times more power than the RAM array of FIG. 6(B).

Therefore, the voltage regulator 402 offers a significant power reduction compared to the fixed retention voltage Vddr0 of FIG. 6(A). In a practical system the adaptive retention voltage Vddr will not be as low as 186 mV, such that there is unlikely to be an 18 times improvement in power consumption. However, a practical system is likely to benefit from a factor of 4.5 retention current reduction.

Light may induce leakage currents in a RAM cell 100 and the voltage regulator 402. As the voltage regulator 402 is adaptive, the retention voltage Vddr will adapt to ensure that data is not lost under these conditions.

In the case of a flash light, the voltage regulator 402 may be too slow to adapt such that there could be data loss. Also, electromagnetic interference (EMI) or electrostatic discharge (ESD) injected pulses may cause data loss. In such cases, the voltage margin could be adjusted to ensure that the retention voltage Vddr is sufficiently large to prevent data loss.

Similarly, if ionising radiation affects the RAM cell 100 and the voltage regulator 402, and this may be overcome by the adaptive retention voltage Vddr and/or by adjusting the voltage margin.

The voltage regulators 300, 400, 402 of this disclosure are particularly useful for nanotechnology (for example, 55 nm technology and below) where threshold voltages are lower and channel length is much shorter when compared with sub-micron technologies (for example 0.13 µm and above). This results in leakage currents being more prominent in nanotechnologies.

Various improvements and modifications may be made to the above without departing from the scope of the disclosure.

What is claimed is:

1. A voltage regulator for generating a retention voltage that is sufficiently high to prevent loss of data in a RAM cell, wherein the voltage regulator comprises:
   mirror circuitry;
   a leakage device coupled to the mirror circuitry; and
   one or more resistive devices coupled to the mirror circuitry, the, or each resistive device having an output node and the or each, resistive device being coupled to the mirror circuitry via their respective output nodes; wherein:
   the mirror circuitry mirrors a leakage current from the leakage device to the, or each, resistive device;
   the leakage current contributes to the generation of a reference voltage at the, or each, output node;
   the retention voltage is provided by the or one of the reference voltages;
   the leakage device comprises one or more leakage transistors; and
   the, or each, leakage transistor is in an off state.

2. The voltage regulator of claim 1, wherein the leakage device comprises a plurality of leakage transistors, the leakage transistors comprising a first and second leakage transistor coupled in parallel.

3. The voltage regulator of claim 1, wherein the leakage device is configured to have a leakage current greater than a leakage current of an associated leakage device of the RAM cell.

4. The voltage regulator of claim 1, wherein the, or each, reference voltage is adaptive to temperature variations and/or process corners.

5. The voltage regulator of claim 1, comprising:
   a first resistive device coupled to the mirror circuitry via a first output node; wherein:
   the mirror circuitry mirrors the leakage current from the leakage device to the first resistive device; and
   the leakage current contributes to the generation of a first reference voltage at the first output node.

6. The voltage regulator of claim 5, comprising:
   a second resistive device coupled to the mirror circuitry via a second output node; wherein:
   the mirror circuitry mirrors the leakage current from the leakage device to the second resistive device; and
   the leakage current contributes to the generation of a second reference voltage at the second output node.

7. The voltage regulator of claim 6, wherein the retention voltage that is output by the voltage regulator corresponds to one of the first reference voltage and the second reference voltage.

8. The voltage regulator of claim 7, wherein the retention voltage corresponds to the greater of the first reference voltage and the second reference voltage.

9. The voltage regulator of claim 5, wherein the mirror circuitry comprises a current mirror, the current mirror comprising a plurality of current mirror transistors.

10. The voltage regulator of claim 9, wherein:
    the mirror circuitry comprises a leakage transistor that is arranged to provide an additional leakage current to the first resistive device; and
    the additional leakage current contributes to the generation of the first reference voltage at the first output node.

11. The voltage regulator of claim 10, wherein the leakage transistor is in an off state.

12. The voltage regulator of claim 5, comprising a unity gain buffer, wherein:
    the first reference voltage is received by an input of the unity gain buffer; and
    an output of the unity gain buffer outputs the retention voltage.

13. The voltage regulator of claim 5, wherein the first resistive device comprises a resistive transistor.

14. The voltage regulator of claim 13, wherein the first reference voltage is a gate-source voltage of the first resistive transistor.

15. The voltage regulator of claim 14, wherein the first resistive transistor is diode connected.

16. An apparatus comprising:
    a RAM cell for storing data and arranged to receive a retention voltage; and
    a voltage regulator for generating a retention voltage that is sufficiently high to prevent loss of data in the RAM cell; wherein:
    the voltage regulator comprises:
    mirror circuitry;
    a leakage device coupled to the mirror circuitry; and
    one or more resistive devices coupled to the mirror circuitry, the, or each, resistive device having an output node and the, or each, resistive device being coupled to the mirror circuitry via their respective output nodes; wherein:
    the mirror circuitry mirrors a leakage current from the leakage device to the, or each, resistive device;
    the leakage current contributes to the generation of a reference voltage at the, or each, output node;
    the retention voltage is provided by the or one of the reference voltages;
    the leakage device comprises one or more leakage transistors; and
    the, or each, leakage transistor is in an off state.

17. A method for generating a retention voltage that is sufficiently high to prevent loss of data in a RAM cell using a voltage regulator, wherein the voltage regulator comprises:
    mirror circuitry;
    a leakage device coupled to the mirror circuitry; and
    one or more resistive devices coupled to the mirror circuitry, the, or each, resistive device having an output node and the, or each, resistive device being coupled to the mirror circuitry via their respective output nodes; wherein the method comprises:

mirroring a leakage current from the leakage device to the, or each, resistive device using the mirror circuitry, wherein the leakage current contributes to the generation of a reference voltage at the, or each, output node; and:

providing the retention voltage, wherein the retention voltage is provided by the or one of the reference voltages; wherein:

the leakage device comprises one or more leakage transistors; and the, or each, leakage transistor is in an off state.

18. The method of claim 17 for generating a retention voltage for a RAM cell, comprising:

mirroring the leakage current from the leakage device to a second first resistive device;

generating a first reference voltage at a first output node associated with the first resistive device, the first reference voltage being generated at least partly from the leakage current mirrored to the second resistive device.

* * * * *

UNITED STATES PATENT AND TRADEMARK OFFICE
CERTIFICATE OF CORRECTION

PATENT NO. : 10,847,189 B1
APPLICATION NO. : 16/107720
DATED : November 24, 2020
INVENTOR(S) : Petrus Hendrikus Seesink Page 1 of 1

It is certified that error appears in the above-identified patent and that said Letters Patent is hereby corrected as shown below:

In the Claims

Column 15, Line 14-21, should read:
18. The method of claim 17 for generating a retention voltage for a RAM cell, comprising: mirroring the leakage current from the leakage device to a first resistive device; generating a first reference voltage at a first output node associated with the first resistive device, the first reference voltage being generated at least partly from the leakage current mirrored to the first resistive device.

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*